US011387939B2

(12) United States Patent
Chen et al.

(10) Patent No.: US 11,387,939 B2
(45) Date of Patent: Jul. 12, 2022

(54) POLAR CODED HYBRID AUTOMATIC REPEAT REQUEST (HARQ) WITH INCREMENTAL CHANNEL POLARIZATION

(71) Applicant: QUALCOMM Incorporated, San Diego, CA (US)

(72) Inventors: Kai Chen, Guangdong (CN); Liangming Wu, Beijing (CN); Changlong Xu, Beijing (CN); Jian Li, Beijing (CN); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/733,499

(22) PCT Filed: Jan. 17, 2019

(86) PCT No.: PCT/CN2019/072084
§ 371 (c)(1),
(2) Date: Aug. 12, 2020

(87) PCT Pub. No.: WO2019/157899
PCT Pub. Date: Aug. 22, 2019

(65) Prior Publication Data
US 2021/0105089 A1    Apr. 8, 2021

(30) Foreign Application Priority Data
Feb. 13, 2018 (WO) ................ PCT/CN2018/076612

(51) Int. Cl.
*H04L 1/00* (2006.01)
*H04L 1/18* (2006.01)

(52) U.S. Cl.
CPC .......... *H04L 1/0067* (2013.01); *H04L 1/0057* (2013.01); *H04L 1/189* (2013.01); *H04L 1/1812* (2013.01)

(58) Field of Classification Search
CPC ... H04L 1/0067; H04L 1/0057; H04L 1/1812; H04L 1/189; H04L 1/1822
See application file for complete search history.

(56) References Cited

U.S. PATENT DOCUMENTS 9,723,508 B2 *   8/2017   Davydov ................ H04B 1/12
10,903,857 B2 *  1/2021   Noh ........................ H04L 1/18
(Continued)

FOREIGN PATENT DOCUMENTS

CN       103281166 A       9/2013
CN       105743621 A       7/2016
(Continued)

OTHER PUBLICATIONS

International Search Report and Written Opinion—PCT/CN2018/076612—ISA/EPO—Oct. 26, 2018.
(Continued)

*Primary Examiner* — Chandrahas B Patel
(74) *Attorney, Agent, or Firm* — Harrity & Harrity, LLP/Qualcomm

(57) ABSTRACT

Various aspects of the present disclosure generally relate to wireless communication. In some aspects, a wireless communication device may perform a first polar code encoding process on a first transmission of a hybrid automatic repeat request (HARQ) process; generate a second transmission of the HARQ process by relocating a portion of bits in less reliable positions of the first transmission to more reliable positions of the second transmission of the HARQ process, wherein the less reliable positions and the more reliable positions are evaluated based at least in part on a channel transform, wherein the channel transform is based at least in part on the first transmission, the second transmission, the first polar encoding process and a second polar encoding process associated with the second transmission; and trans- (Continued)

mit the second transmission of the HARQ process. Numerous other aspects are provided.

30 Claims, 14 Drawing Sheets

(56) References Cited

U.S. PATENT DOCUMENTS

| | | | | |
|---|---|---|---|---|
| 10,932,241 | B2* | 2/2021 | Kwak | ............... H04L 1/1812 |
| 11,031,955 | B2* | 6/2021 | Hui | ............... H03M 13/6306 |
| 2017/0135102 | A1 | 5/2017 | Ma et al. | |
| 2021/0068138 | A1* | 3/2021 | Baldemair | ........ H04W 72/0413 |

FOREIGN PATENT DOCUMENTS

| | | |
|---|---|---|
| CN | 106817195 A | 6/2017 |
| CN | 107395324 A | 11/2017 |
| WO | 2015100572 A1 | 7/2015 |
| WO | 2017157028 A1 | 9/2017 |

OTHER PUBLICATIONS

International Search Report and Written Opinion—PCT/CN2019/072084—ISA/EPO—Apr. 17, 2019.

Zte et al., "HARQ Performance of Rate-Compatible Polar codes", 3GPP TSG RAN WG1 #86bis, R1-1611110 Nov. 18, 2016, 6 pages.

Huawei, et al., "IR-HARQ Scheme for Polar Codes," 3GPP Draft; R1-1700406, 3GPP Tsg Ran WG1 Nr Ad-Hoc Meeting, HARQ Scheme for Polar Codes, 3rd Generation Partnership Project (3GPP), Mobile Competence Centre, 650, Route Des Lucioles, F-06921 Sophia-Antipolis Cedex, France, vol. Ran WG1, No. Spokane, USA, 20170116-20170120, Jan. 16, 2017, XP051207943, 4 p. Retrieved from the Internet: URL: http://www.3gpp.org/ftp/Meetings_3GPP_SYNC/RAN1/Docs/ [retrieved on 2017-01-16], pp. 1-3, figures 1-3.

Huawei, et al., "HARQ Scheme for Polar Codes," 3GPP Draft, 3GPP Tsg Ran WG1 Meeting #87, R1-1613301, Harq Scheme for Polar Codes, 3rd Generation Partnership Project (3GPP), Mobile Competence Centre, 650, Route Des Lucioles F-06921 Sophia-Antipolis Cedex, France, vol. Ran WG1, No. Reno, USA, 20161114-20161118, Nov. 19, 2016, XP051191170, 41 p. Retrieved from the Internet: URL: http://www.3gpp.org/ftp/tsg_ran/WG1_RL1/TSGR1_87/Docs/ [retrieved on 2016-11-19], Section 2, figures 4,5, [Lines 4 to 5 of p. 2 and Lines 1 to 2 of p. 3], Section 2.2 "Incremental Redundancy HARQ Design", pp. 3-8, figures 5-7, Section 2.1 "Incremental Freezing HARQ design", pp. 1-3.

Ma L., et al., "An Incremental Redundancy HARQ Scheme for Polar Code", Aug. 31, 2017 (2017-08-31), pp. 1-6, XP055449712, Retrieved from the Internet: URL: https://arxiv.org/pdf/1708.09679.pdf [retrieved on 2018-02-09] Section 3 "IR-HARQ for polar code", pp. 2-4, Figures 2,3.

Supplementary European Search Report - EP19753738 - Search Authority- Munich - 2021-09-24 (182052EP).

* cited by examiner

POLAR CODED HYBRID AUTOMATIC REPEAT REQUEST (HARQ) WITH INCREMENTAL CHANNEL POLARIZATION

CROSS-REFERENCE TO RELATED APPLICATIONS

This application is a 371 national stage of PCT Application No. PCT/CN2019/072084 filed on Jan. 17, 2019, entitled POLAR CODED HYBRID AUTOMATIC REPEAT REQUEST (HARQ) WITH INCREMENTAL CHANNEL POLARIZATION," which claims priority to Patent Cooperation Treaty (PCT) Patent Application No. PCT/CN2018/076612, filed on Feb. 13, 2018, entitled "TECHNIQUES AND APPARATUSES FOR A POLAR CODED HYBRID AUTOMATIC REPEAT REQUEST (HARQ) WITH INCREMENTAL CHANNEL POLARIZATION," both of which are hereby expressly incorporated by reference herein.

FIELD OF THE DISCLOSURE

Aspects of the present disclosure generally relate to wireless communication, and more particularly to techniques and apparatuses for a polar coded hybrid automatic repeat request (HARQ) with incremental channel polarization.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a new radio (NR) BS, a 5G Node B, and/or the like.

The above multiple access technologies have been adopted in various telecommunication standards to provide a common protocol that enables different user equipment to communicate on a municipal, national, regional, and even global level. New radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements should be applicable to other multiple access technologies and the telecommunication standards that employ these technologies.

SUMMARY

In some aspects, a method of wireless communication may include performing a first polar code encoding process on a first transmission of a HARQ process; generating a second transmission of the HARQ process by relocating a portion of bits in less reliable positions of the first transmission to more reliable positions of the second transmission of the HARQ process, wherein the less reliable positions and the more reliable positions are evaluated based at least in part on a channel transform, wherein the channel transform is based at least in part on the first transmission, the second transmission, the first polar encoding process and a second polar encoding process associated with the second transmission; and transmitting the second transmission of the HARQ process.

In some aspects, a wireless communication device for wireless communication may include memory and one or more processors operatively coupled to the memory. The memory and the one or more processors may be configured to perform a first polar code encoding process on a first transmission of a HARQ process; generate a second transmission of the HARQ process by relocating a portion of bits in less reliable positions of the first transmission to more reliable positions of the second transmission of the HARQ process, wherein the less reliable positions and the more reliable positions are evaluated based at least in part on a channel transform, wherein the channel transform is based at least in part on the first transmission, the second transmission, the first polar encoding process and a second polar encoding process associated with the second transmission; and transmit the second transmission of the HARQ process.

In some aspects, a non-transitory computer-readable medium may store one or more instructions for wireless communication. The one or more instructions, when executed by one or more processors of a user equipment, may cause the one or more processors to perform a first polar code encoding process on a first transmission of a HARQ process; generate a second transmission of the HARQ process by relocating a portion of bits in less reliable positions of the first transmission to more reliable positions of the second transmission of the HARQ process, wherein the less reliable positions and the more reliable positions are evaluated based at least in part on a channel transform, wherein the channel transform is based at least in part on the first transmission, the second transmission, the first polar encoding process and a second polar encoding process associated with the second transmission; and transmit the second transmission of the HARQ process.

In some aspects, an apparatus for wireless communication may include means for performing a first polar code encoding process on a first transmission of a HARQ process; means for generating a second transmission of the HARQ process by relocating a portion of bits in less reliable positions of the first transmission to more reliable positions of the second transmission of the HARQ process, wherein the less reliable positions and the more reliable positions are evaluated based at least in part on a channel transform, wherein the channel transform is based at least in part on the first transmission, the second transmission, the first polar encoding process and a second polar encoding process associated with the second transmission; and means for transmitting the second transmission of the HARQ process.

Aspects generally include a method, apparatus, system, computer program product, non-transitory computer-readable medium, user equipment, wireless communication device, and processing system as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It is noted that while aspects may be described herein using terminology commonly associated with 3G and/or 4G wireless technologies, aspects of the present disclosure can be applied in other generation-based communication systems, such as 5G and later, including NR technologies.

Figure 1:
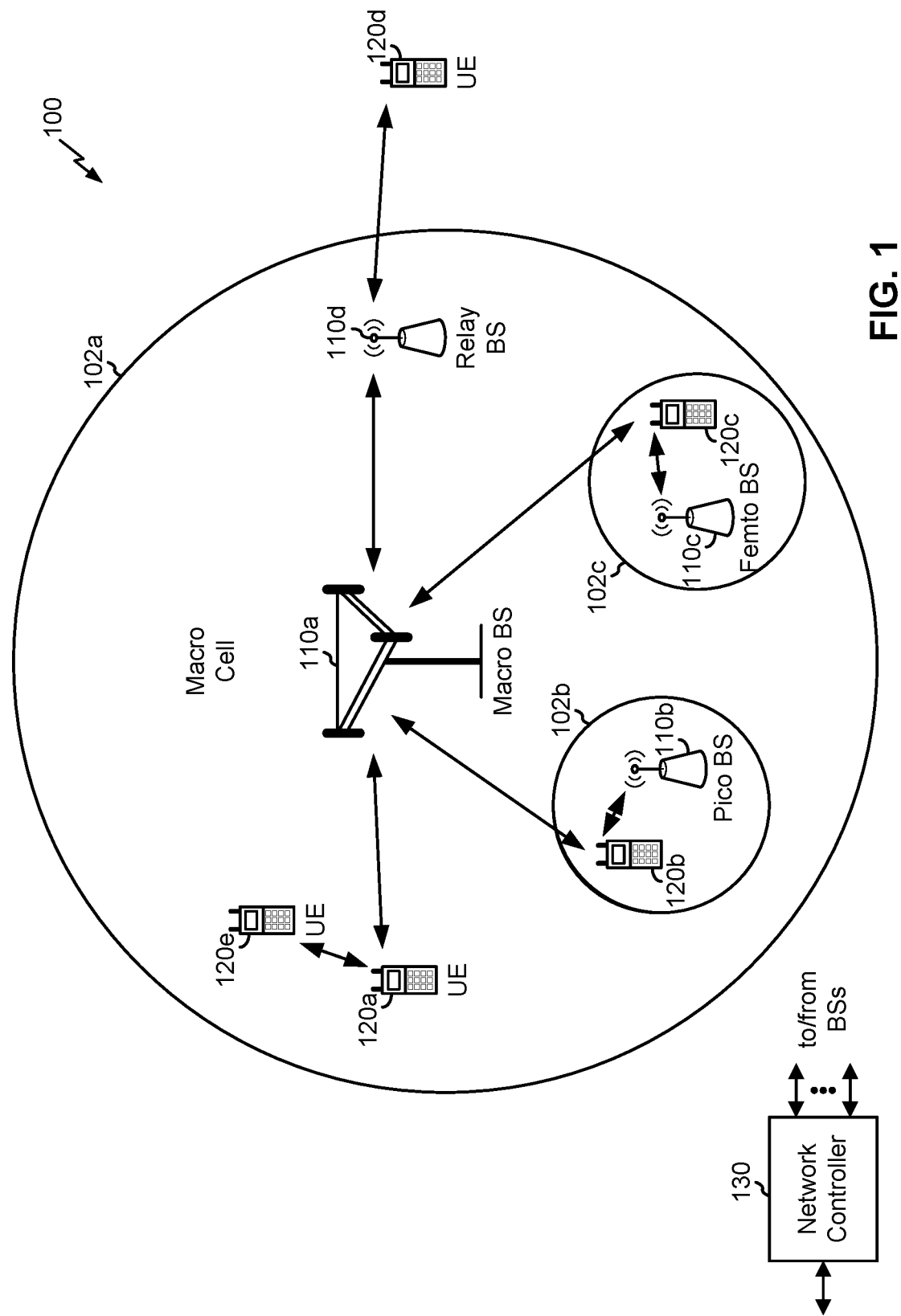
FIG. 1 is a block diagram conceptually illustrating an example of a wireless communication network, in accordance with various aspects of the present disclosure.

FIG. 1 is a diagram illustrating a network 100 in which aspects of the present disclosure may be practiced. The network 100 may be an LTE network or some other wireless network, such as a 5G or NR network. Wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the access network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impact on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, such as sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as may be implemented as NB-IoT (narrowband internet of things) devices. Some UEs may be considered a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular RAT and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided as an example. Other examples may differ from what is described with regard to FIG. 1.

Figure 2:
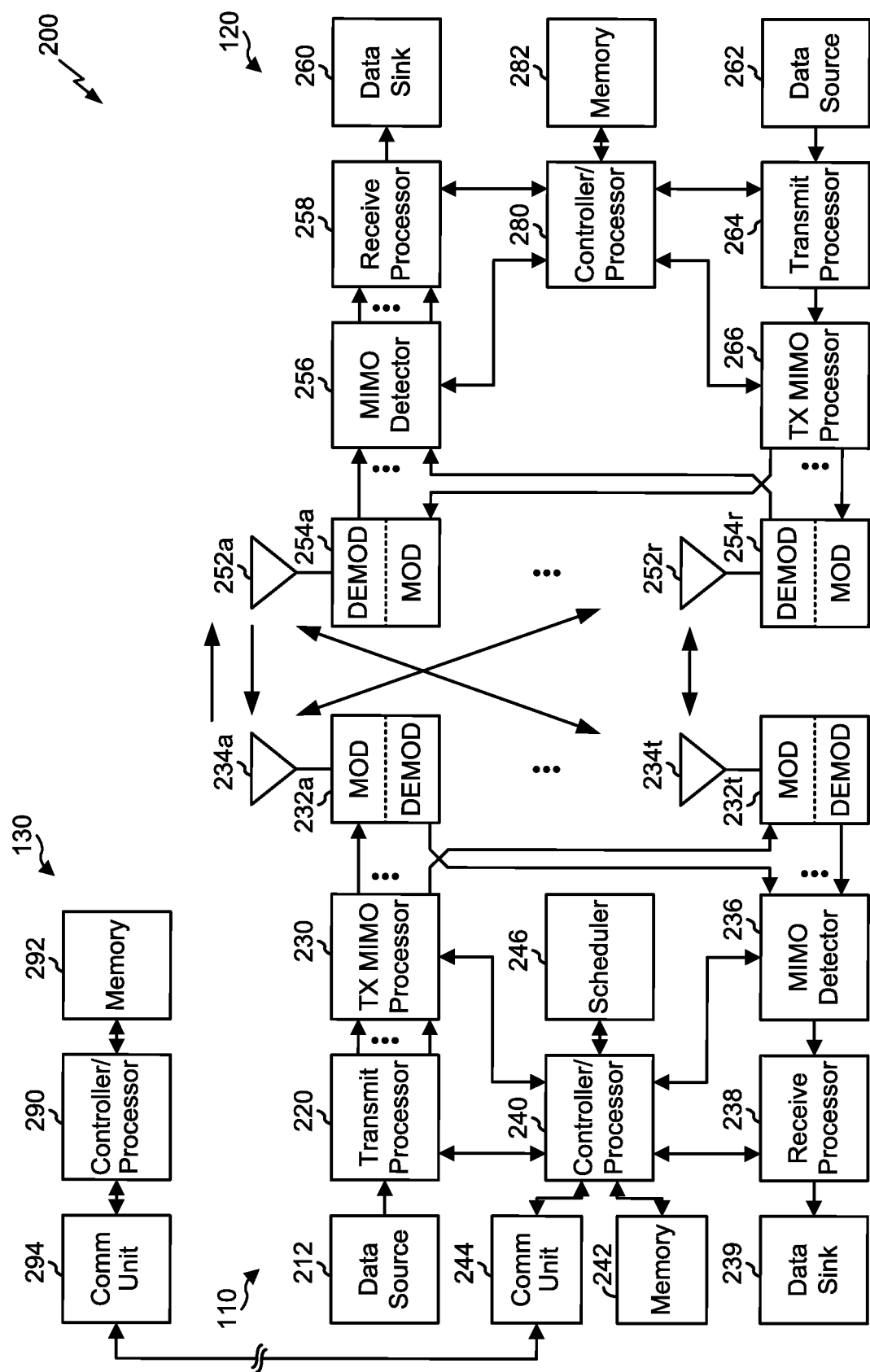
FIG. 2 is a block diagram conceptually illustrating an example of a base station in communication with a user equipment (UE) in a wireless communication network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

In some aspects, one or more components of UE 120 may be included in a housing. Controller/processor 240 of base station 110, controller/processor 280 of UE 120, and/or any other component(s) of FIG. 2 may perform one or more techniques associated with a polar coded hybrid automatic repeat request (HARD) with incremental channel polarization, as described in more detail elsewhere herein. For example, controller/processor 240 of base station 110, controller/processor 280 of UE 120, and/or any other component(s) of FIG. 2 may perform or direct operations of, for example, process 1400 of FIG. 14, and/or other processes as described herein. Memories 242 and 282 may store data and program codes for base station 110 and UE 120, respectively. A scheduler 246 may schedule UEs for data transmission on the downlink and/or uplink.

In some aspects, UE 120 may include means for performing a first polar code encoding process on a first transmission of a HARQ process; means for generating a second transmission of the HARQ process by relocating a portion of bits in less reliable positions of the first transmission to more reliable positions of the second transmission of the HARQ process, wherein the less reliable positions and the more reliable positions are evaluated based at least in part on a channel transform, wherein the channel transform is based at least in part on the first transmission, the second transmission, the first polar encoding process and a second polar encoding process associated with the second transmission; and means for transmitting the second transmission of the HARQ process, and/or the like. In some aspects, such means may include one or more components of UE 120 described in connection with FIG. 2.

In some aspects, base station 110 may include means for performing a first polar code encoding process on a first transmission of a HARQ process; means for generating a second transmission of the HARQ process by relocating a portion of bits in less reliable positions of the first transmission to more reliable positions of the second transmission of the HARQ process, wherein the less reliable positions and the more reliable positions are evaluated based at least in part on a channel transform, wherein the channel transform is based at least in part on the first transmission, the second transmission, the first polar encoding process and a second polar encoding process associated with the second transmission; and means for transmitting the second transmission of the HARQ process, and/or the like. In some aspects, such means may include one or more components of base station 110 described in connection with FIG. 2.

As indicated above, FIG. 2 is provided as an example. Other examples may differ from what is described with regard to FIG. 2.

In many instances, wireless communication systems may use polar coding to identify reliable bits after a channel polarization transform and relocate data onto those active bits. Polar coding may be implemented in a hybrid automatic repeat request (HARQ) process of the wireless communication. For example, in HARQ Chase combining (HARQ-CC) systems, a same codeword can be transmitted within each transmission of the HARQ system. In HARQ incremental redundancy (HARQ-IR) systems, additional coding gain can be attained, as a relatively long codeword can be incrementally transmitted within each transmission and a receiver can buffer the transmissions for decoding. However, in HARQ-IR, because information indices are fixed to optimize the first transmission, there is no opportunity to adjust positions of bits of the codeword in following retransmissions.

According to some aspects described herein, a polar coded HARQ scheme with incremental channel polarization (which may be referred to herein as IP-HARQ) is provided to enable multiple transmissions of a HARQ process (e.g., each transmission of the HARQ process and/or all transmissions of the HARQ process) to adjust and/or relocate bits from less reliable bit positions to more reliable bit positions. Accordingly, in some aspects, each transmission of an IP-HARQ process can be flexible and include a different code length and/or a different rate-matching scheme according to a channel polarization transform of previous transmissions. Furthermore, the example IP-HARQ process can achieve a desired capacity using an incremental channel transform. In some implementations, various incremental transforms can be adjusted (e.g., depending on a desired configuration of the wireless communication system).

Accordingly, as described in some aspects herein, an IP-HARQ process ensures that multiple transmissions or all transmission of a HARQ process can take advantage of polar coding by adjusting bits of a previous transmission from less reliable bit positions to more reliable bit positions of a subsequent transmission of the HARQ.

Figure 3:
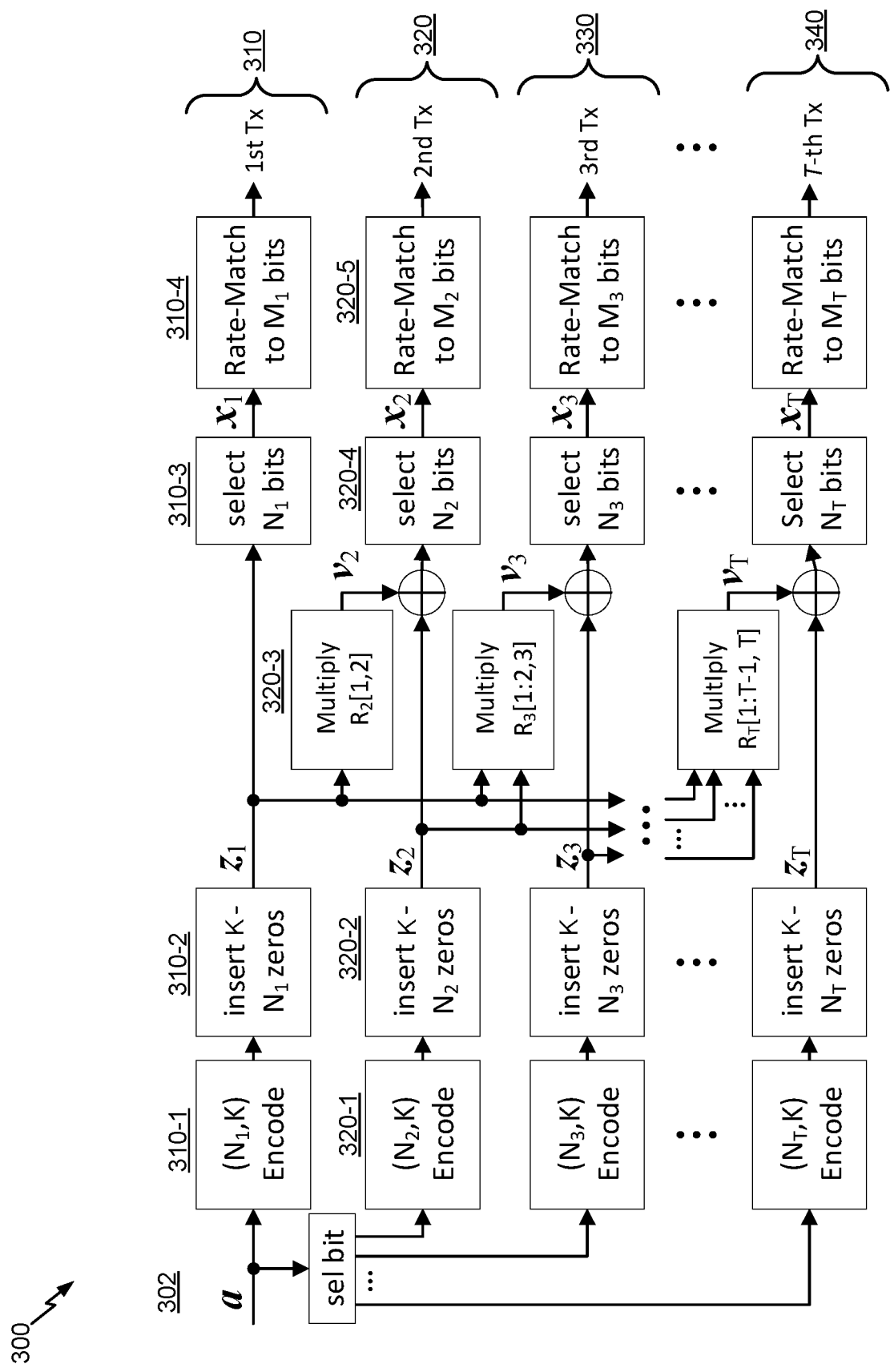
FIG. 3 is a diagram illustrating an example of polar coded HARQ with incremental channel polarization, in accordance with various aspects of the present disclosure.

FIG. 3 is a diagram illustrating an example 300 of a polar coded HARQ with incremental channel polarization, in accordance with various aspects of the present disclosure. As mentioned above, when using polar coding in some HARQ schemes (e.g., HARQ-IR), each transmission of the HARQ process may use a same polarization channel transform. In the example 300 of FIG. 3, an IP-HARQ process is shown that enables bits to be adjusted between T transmissions (shown as Tx) of the HARQ process. Furthermore, in the example 300 of FIG. 3, bits in less reliable bit positions of a previous transmission are adjusted to more reliable bit positions in subsequent transmissions using a channel transform matrix $R_T$, which is incremented (in size) according to the round of the IP-HARQ process. For example, for round number two of the IP-HARQ process, the channel transform matrix $R_2$ is a 2×2 matrix; for round number three of the IP-HARQ process, the channel transform matrix $R_3$ is a 3×3 matrix; for round number four of the IP-HARQ process, the channel transform matrix $R_4$ is a 4×4 matrix, and so on.

As shown in FIG. 3, and by reference number 302, data is received and is to be transmitted via an IP-HARQ process. A first HARQ transmission (or round one of the IP-HARQ process) is shown by reference numbers 310-1 through 310-4. As shown by reference number 310-1, in a first transmission (shown as 1st Tx) of a portion of the data, a wireless communication device (e.g., BS 110 and/or UE 120), can encode $N_1$ bits of data (which can be any number of bits of the data) for a transmission of length K. For example, the wireless communication device can perform a polar encoding process on the $N_1$ bits of the data. As shown by reference number 310-2, the wireless communication device can insert $K-N_1$ zero bits into the transmission to create codeword $Z_1$ of the first transmission (e.g., to ensure the first transmission is the appropriate bit length).

As shown by reference number 310-3 of FIG. 3, the $N_1$ bits of the first transmission can be selected to create codeword $X_1$ of the first transmission. In some implementations, because the same $N_1$ bits are to be selected from the first transmission, the wireless communication device may not insert the zero bits into codeword $X_1$ of the first transmission as described in connection with reference number 310-2. As shown by reference number 310-4, the wireless communication device can perform rate-matching of $X_1$ of the first transmission to $M_1$ bits corresponding to the rate-matching technique used (e.g., repetition rate-matching, puncture rate-matching, or shorten rate-matching). After the rate-matching technique is applied to the $M_1$ bits, the wireless communication device may transmit the first transmission of the IP-HARQ process.

As shown further shown in FIG. 3 and by reference number 320, the IP-HARQ process is used to perform a second HARQ transmission (or round two of the IP-HARQ process). As shown by reference number 320-1, in a second transmission (shown as 2nd Tx) of a portion of the data, a wireless communication device (e.g., BS 110 and/or UE 120), can encode $N_2$ bits of data (which can be any number of bits of the data) for a transmission of length K. For example, the wireless communication device can perform a polar encoding process on the $N_2$ bits of the data. As shown by reference number 320-2, the wireless communication device can insert $K-N_2$ zero bits into the transmission to create codeword $Z_2$ of the second transmission. As shown by reference number 320-3, the codeword $Z_1$ of the first transmission is multiplied with a channel transform matrix $R_2$ (e.g., a 2×2 upper triangle matrix and combined with the codeword $Z_2$ of the second transmission) to create codeword $V_2$ for the second transmission. In such cases, use of the matrix $R_2$ causes bits in less reliable bit positions of the first transmission to be relocated to more reliable bit positions of the second transmission. The codeword $Z_2$ of the second transmission is then combined with the codeword $V_2$. Accordingly, those bits of the codeword $Z_2$ of the second transmission are added to the codeword $V_2$ to ensure (or at least increase a likelihood) that the bits in the less reliable bit positions of the first transmission are transmitted in the second transmission.

As shown by reference number 320-4 of FIG. 3, the $N_2$ bits of the second transmission are selected from the codeword $V_2$ of the second transmission to create codeword $X_2$ of the second transmission. As shown by reference number 320-5, the wireless communication device can perform rate-matching of the codeword $X_2$ of the second transmission to $M_2$ bits corresponding to rate-matching technique used (e.g., repetition rate-matching, puncture rate-matching, or shorten rate-matching) for the second transmission (which can be configurable). After the rate-matching technique is applied for $M_2$ bits, the wireless communication device may transmit the second transmission of the IP-HARQ process.

In a similar manner as the second transmission, as shown by reference number 330 of FIG. 3, the IP-HARQ process is used to perform a third HARQ transmission (or round three of the IP-HARQ process). However, during the third transmission, a 3×3 channel transform matrix $R_3$ is used to relocate bits in less reliable bit positions of the first transmission and second transmission to more reliable bit positions in the third transmission (shown as 3rd Tx). Furthermore, as shown by reference number 340, for the T-th transmission (or round T of the IP-HARQ process), a T×T channel transform matrix $R_T$ is used to relocate bits in less reliable bit positions of all previous transmissions (1st Tx to T-1th Tx) to more reliable bit positions of the T-th transmission.

Accordingly, as shown, the IP-HARQ process of FIG. 3 provides an incremental channel transform $R_T$ that is based at least in part on a round of the IP-HARQ process that relocates bits in less reliable bit positions of one or more transmissions to a more reliable bit positions of subsequent transmissions. Therefore, a wireless communication device and/or a wireless communication system, using the IP-HARQ process, can ensure (or at least increase a likelihood) that all bits of data reach an intended destination when transmitted.

As indicated above, FIG. 3 is provided as an example. Other examples may differ from what is described with respect to FIG. 3.

Figure 4:
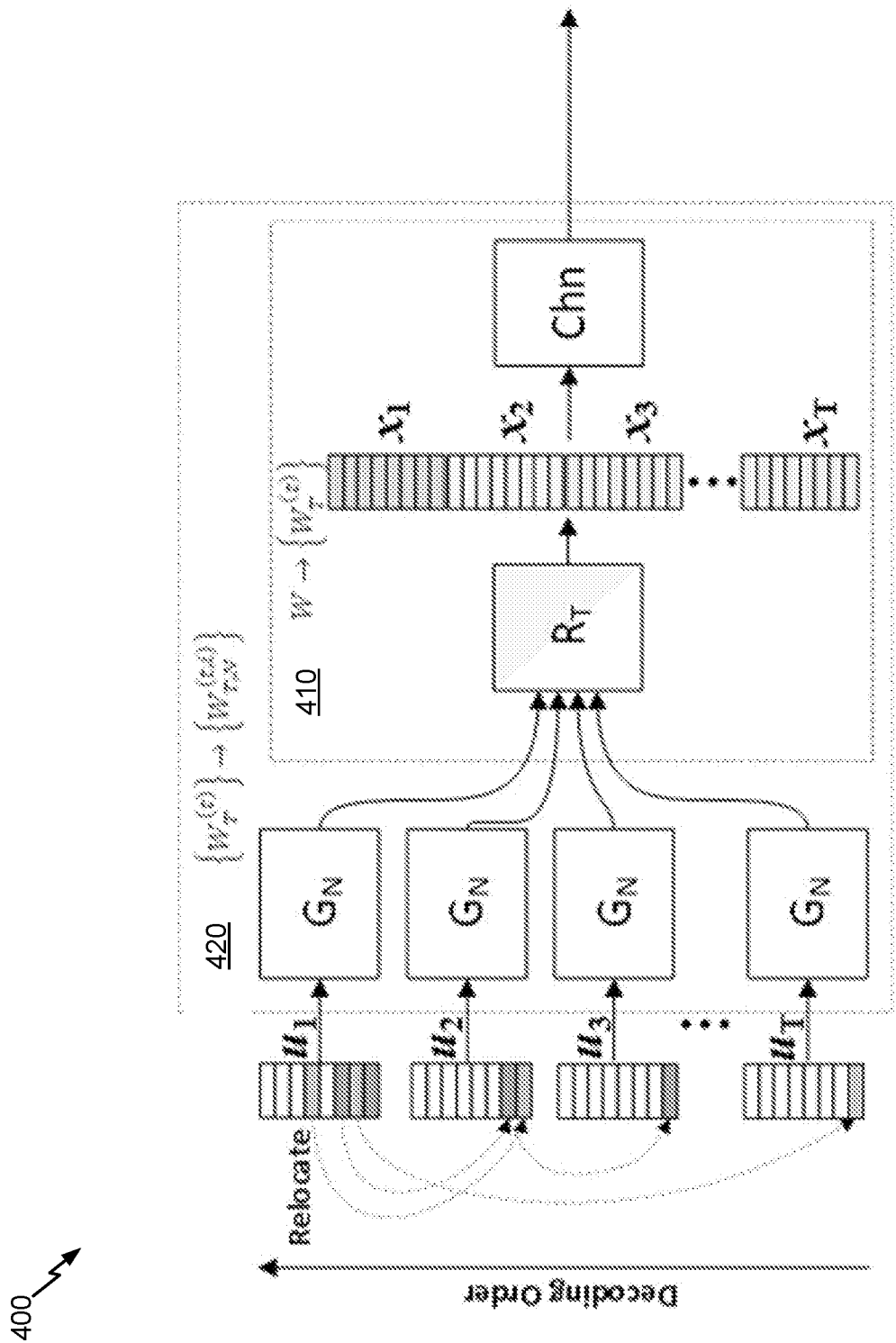
FIG. 4 is a diagram illustrating an example of polar coded HARQ with incremental channel polarization, in accordance with various aspects of the present disclosure.

FIG. 4 is a diagram illustrating an example 400 of a polar coded HARQ with incremental channel polarization, in accordance with various aspects of the present disclosure. In the example 400 of FIG. 4, bits in less reliable bit positions in previous T−1 transmission are shown being relocated to more reliable bit positions in a subsequent transmission T of the IP-HARQ process. As shown in FIG. 4, the channel transform matrix $R_T$ of reference number 410 may correspond to $R_1$-$R_T$ of example 300 of FIG. 3 and the $G_N$ blocks of reference number 420 may correspond to the polar encoding (shown as encode blocks) of example 300 of FIG. 3.

The example 400 of FIG. 4 shows a two-step polarization that relocates and/or copies a number of bits from less reliable bit positions of previous transmissions to more reliable bit positions in subsequent transmissions. For example, because the channel transform matrix $R_T$ is designed to ensure (or at least increase the likelihood) that the decoding order from the T-th transmission is performed before the previous T−1 blocks, corresponding duplicated bits in transmission 1 to T−1 can be regarded as known bits in that the duplicated bits are relocated to the T-th block.

Referring to reference number 410, a first step of the two-step polarization involves combining an underlying channel of up to T transmissions. In some implementations, a wireless communication device may perform the first step of the channel polarization as follows:

$$W_T^{(t)}(y_1, y_2, \ldots y_T, z_{t+1}, z_{t+2}, \ldots z_T \mid z_t) = \sum_{x_{1:(t-1)}} \left( \frac{1}{2^{T-1}} \cdot \prod_{k=1}^{T} W(y_k \mid x_k) \right) \quad (1)$$

where $(x_1, x_2, \ldots, x_T) = (z_1, z_2, \ldots, z_T) \cdot R_T$. As such $W \to \{W_T^{(t)}\}$. According to some aspects, $R_T$ is a sub-matrix and includes T rows and T columns of matrix $R_S$, for any S>T. Therefore, $R_T$ is to be an upper-triangle matrix to provide an "incremental" channel transform.

As further shown by FIG. 4, and by reference number 420, a second step the two-step channel polarization combines N use of channel $W_T^{(t)}$. In some implementations, a wireless communication device may perform the second step of the channel polarization as follows:

$$W_{T,N}^{(t,i)}(y_1 \ldots y_T, u_{t+1} \ldots u_T, u_{t,1:(i-1)} \mid u_{t,i}) = \sum_{u_{t,(i+1):N}, u_1 \ldots u_{t-1}} \left( \frac{1}{2^{N-1}} \cdot \prod_{j=1}^{N} W_T^{(t)}(y_{1,j} \ldots y_{T,j}, z_{t+1,j}, \ldots z_{T,j} \mid z_{t,j}) \right) \quad (2)$$

where $z_t = u_t \cdot G_N$ and $G_N$ is a channel transform as follows:

$$G_N = \begin{bmatrix} 1 & 0 \\ 1 & 1 \end{bmatrix}^{\otimes n} \quad (3)$$

where $n = \log_2 N$, $x_t$ is a variable at the t-th transmission, $x_t$ is a variable at the t-th transmission, $x_{t,i}$ is the i-th element of vector $x_t$, $x_t$, i:j is the subvector of $x_t$ which includes elements indexed from i to j, and $X_N$ is an N×N sized matrix.

Accordingly, incremental channel polarization can be achieved in example 400 of an IP-HARQ process, as shown, using an incremental channel transform. Thus, as shown in FIG. 4, using the two-step channel polarization of example implementation 400, bits in less reliable positions of previous transmissions (T−1) can be relocated and/or copied into more reliable positions of a subsequent transmission (T).

As indicated above, FIG. 4 is provided as an example. Other examples may differ from what is described with respect to FIG. 4.

Figure 5:
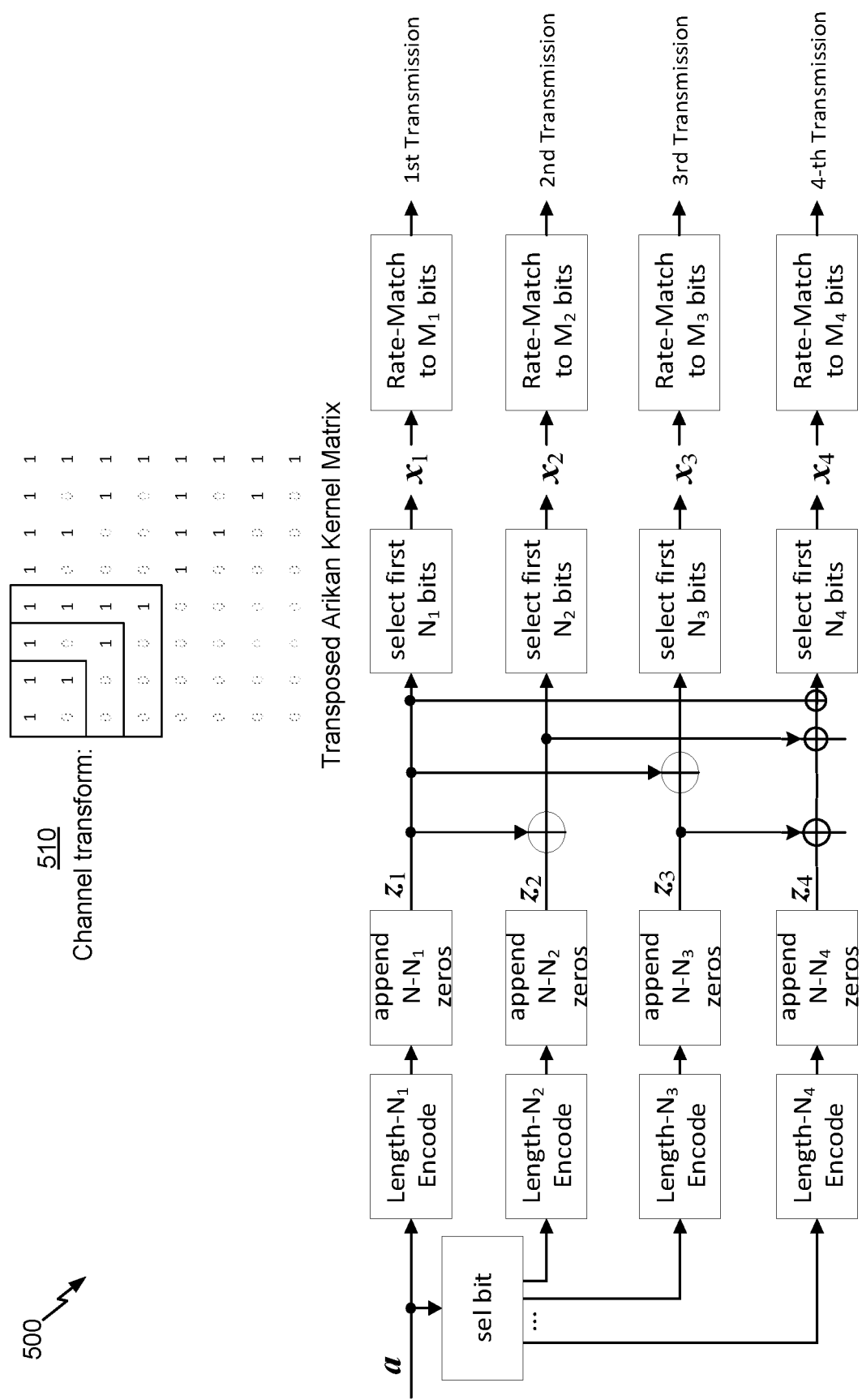
FIG. 5 is a diagram illustrating an example of polar coded HARQ with incremental channel polarization, in accordance with various aspects of the present disclosure.

FIG. 5 is a diagram illustrating an example 500 of a polar coded HARQ with incremental channel polarization, in accordance with various aspects of the present disclosure.

In the example implementation 500 of FIG. 5, there are four transmissions of an IP-HARQ process. In example 500, as shown by reference number 510, a wireless communication device may use a transposed Arikan kernel matrix during incremental channel polarization. Accordingly, as shown, during the channel polarization of the second transmission, the codeword $Z_1$ is combined with the codeword $Z_2$ of the second transmission (corresponding to column 2 of the Arikan kernel matrix). Furthermore, as shown, during the channel polarization of the third transmission, the codeword $Z_1$ of the first transmission is combined with the codeword $Z_3$ of the third transmission (corresponding to column 3 of the Arikan kernel matrix). Finally, as shown in example 500 of FIG. 5, during the channel polarization of the fourth transmission, the codeword $Z_1$ of the first transmission, the codeword $Z_2$ of the second transmission, and the codeword $Z_3$ of the third transmission are combined with the codeword $Z_4$ of the fourth transmission (corresponding to column 4 of the Arikan kernel matrix). Accordingly, a transpose of the Arikan kernel matrix can be used during incremental channel polarization in an IP-HARQ process, as described herein.

As indicated above, FIG. 5 is provided as an example. Other examples may differ from what is described with respect to FIG. 5.

Figure 6:
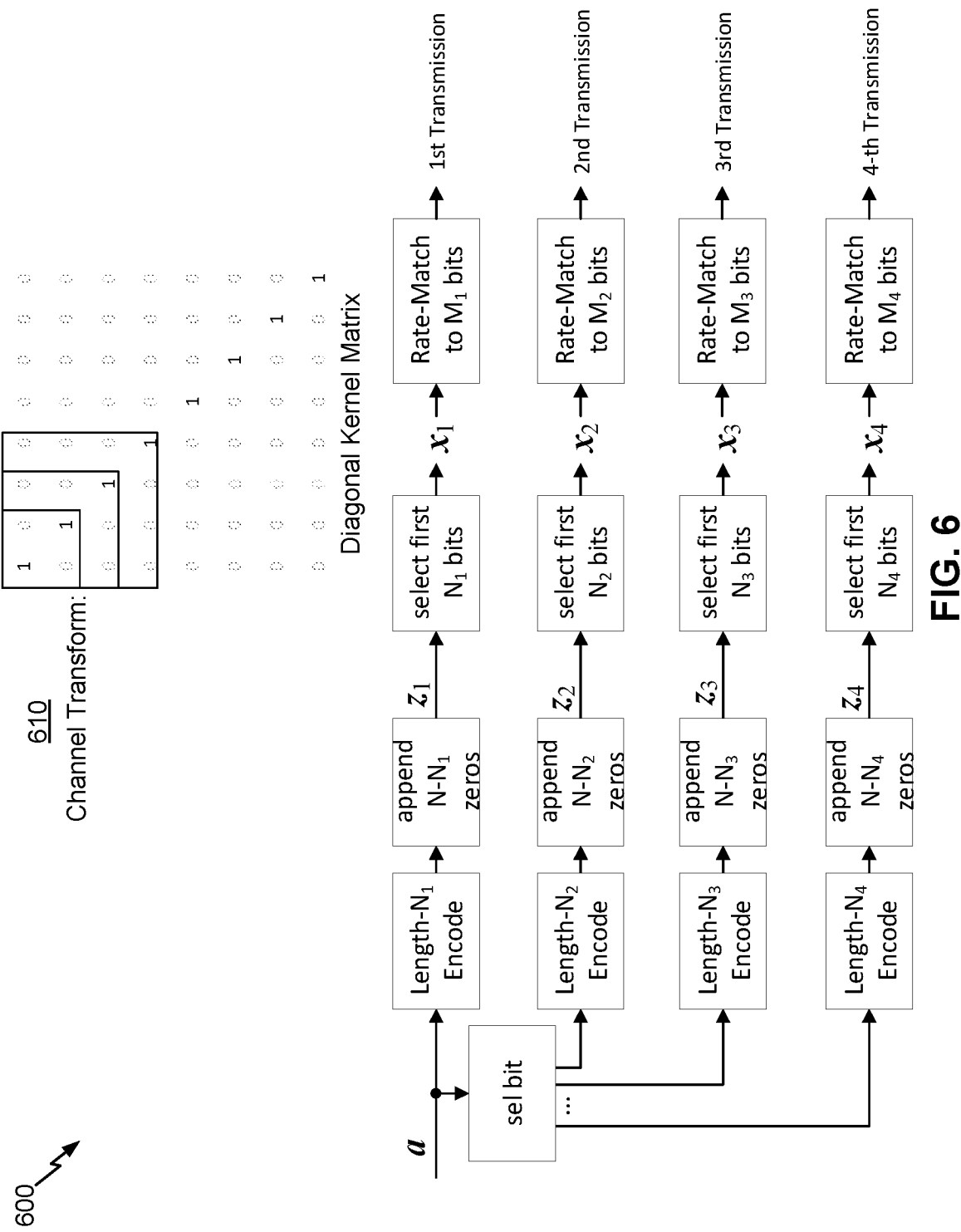
FIG. 6 is a diagram illustrating an example of polar coded HARQ with incremental channel polarization, in accordance with various aspects of the present disclosure.

FIG. 6 is a diagram illustrating an example 600 of polar coded HARQ with incremental channel polarization, in accordance with various aspects of the present disclosure.

In the example implementation 600 of FIG. 6, there are four transmissions of an IP-HARQ process. In example 600, as shown by reference number 610, a wireless communication device may use a diagonal kernel matrix during incremental channel polarization. Accordingly, as shown, during the channel polarization of each of the four transmissions, the codewords $Z_1$-$Z_4$ are passed through as the diagonal kernel matrix does not facilitate combining previous transmissions with subsequent transmissions because there is only a single reliable bit position. Accordingly, selected bits are relocated to the reliable bit position. As such, a diagonal kernel matrix can be used during incremental channel polarization in an IP-HARQ process, as described herein.

As indicated above, FIG. 6 is provided as an example. Other examples may differ from what is described with respect to FIG. 6.

Figure 7:
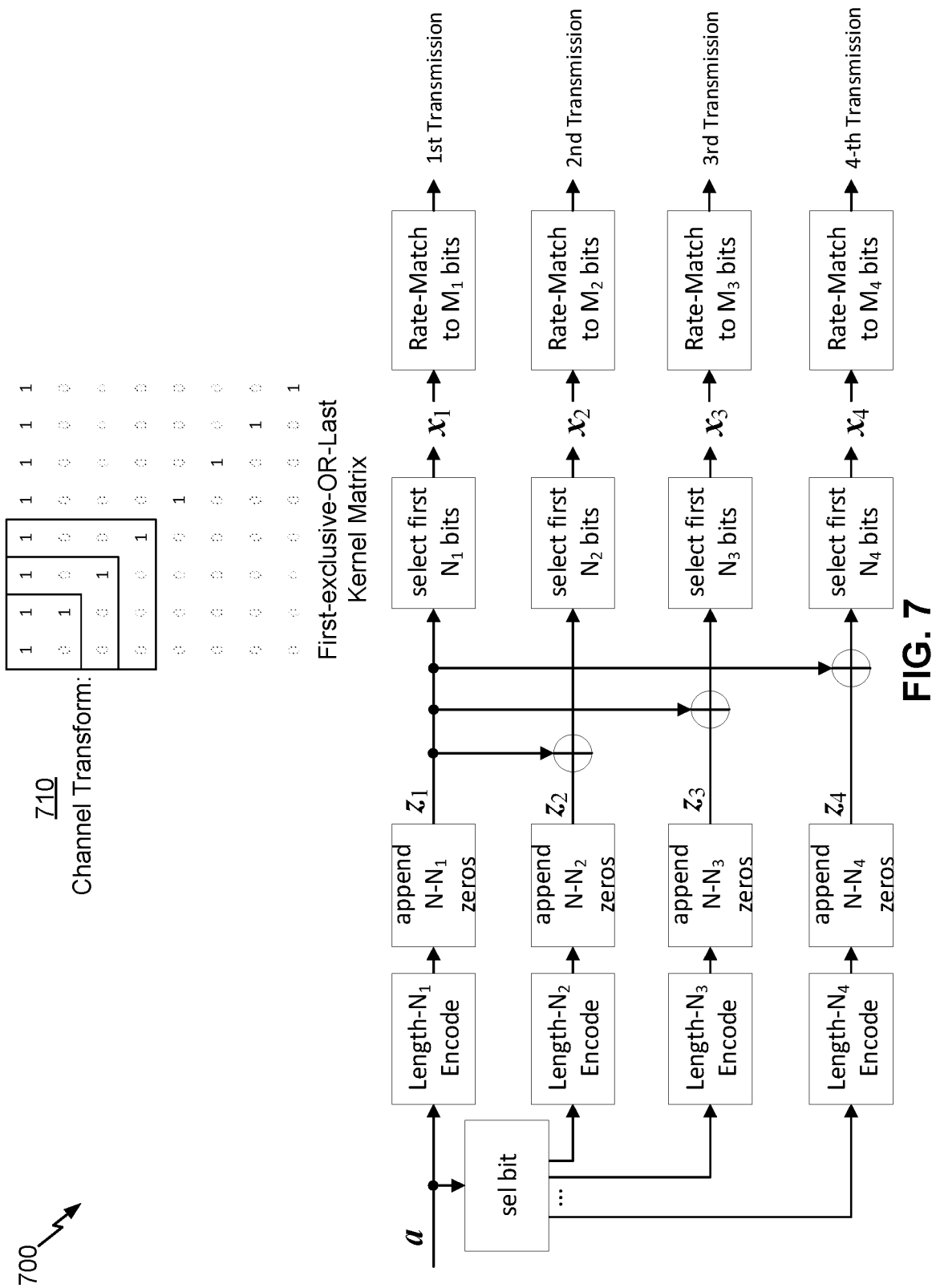
FIG. 7 is a diagram illustrating an example of polar coded HARQ with incremental channel polarization, in accordance with various aspects of the present disclosure.

FIG. 7 is a diagram illustrating an example 700 of a polar coded HARQ with incremental channel polarization, in accordance with various aspects of the present disclosure.

In the example implementation 700 of FIG. 7, there are four transmissions of an IP-HARQ process. In example 700, as shown by reference number 710, a wireless communication device may use a First—exclusive OR—Latest (FL) kernel matrix during incremental channel polarization.

Accordingly, as shown, during the channel polarization of the second transmission, the codeword $Z_1$ is combined with the codeword $Z_2$ of the second transmission (corresponding to column 2 of the FL kernel matrix). Furthermore, as shown, during the channel polarization of the third transmission, the codeword $Z_1$ is combined with the codeword $Z_3$ of the third transmission (corresponding to column 3 of the FL kernel matrix). Finally, as shown in example 500 of FIG. 5, during the channel polarization of the fourth transmission, the codeword $Z_1$ of the first transmission, the codeword $Z_2$ of the second transmission, and the codeword $Z_3$ of the third transmission are combined with the codeword $Z_4$ of the fourth transmission (corresponding to column 4 of the FL kernel matrix). As such, in all subsequent transmissions of example 500, the codeword $Z_1$ of the first transmission is combined with the codeword of the latest (or T-th) transmission. Accordingly, an FL kernel matrix can be used during incremental channel polarization in an IP-HARQ process, as described herein.

As indicated above, FIG. 7 is provided as an example. Other examples may differ from what is described with respect to FIG. 7.

FIGS. 8-13 are diagrams illustrating examples of performance improvements associated with a polar coded hybrid automatic repeat request (IP-HARQ) with incremental channel polarization, in accordance with various aspects of the present disclosure.

Figure 8:
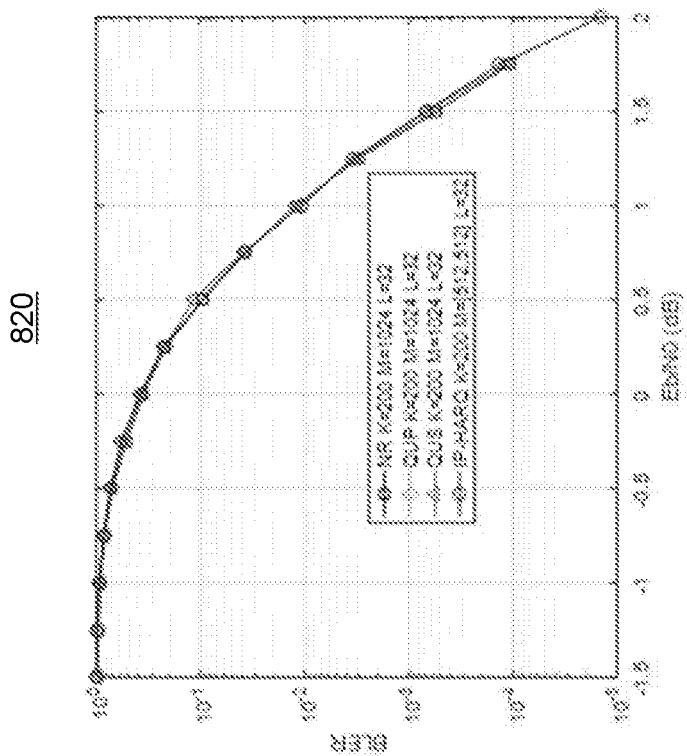
FIGS. 8-13 are example diagrams of performance of polar coded HARQ with incremental channel polarization, in accordance with various aspects of the present disclosure.
Figure 8:
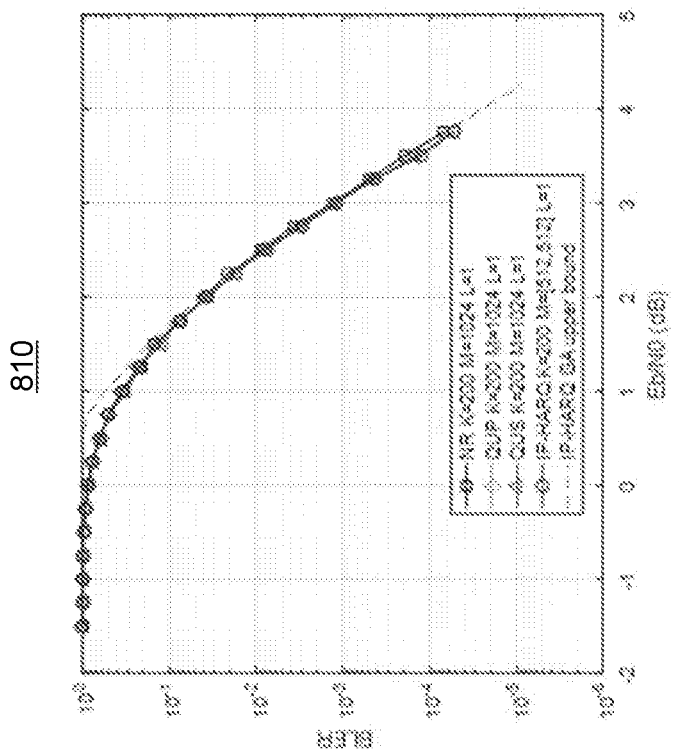

FIG. 8 shows examples 810, 820 of IP-HARQ performance relative to a baseline and bound of a Gaussian Approximation (GA) with a first transmission length ($M_1$) of 512 bits, a second transmission length ($M_2$) of 512 bits, and a codeword length (K) of 200 bits. Example 810 shows performance using a successive cancellation decoder (SC), while example 820 shows performance using a successive cancellation list (SCL) decoder to decode the transmissions. As shown by example 810, performance is within a bound of the GA. In such a case, joint decoding two received transmissions of data under IP-HARQ can achieve the same or similar performance as data constructed as a single code.

Figure 9:
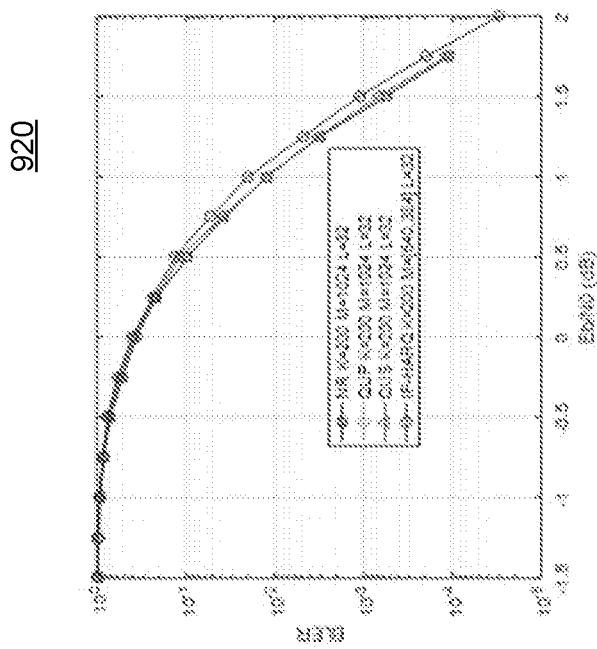
Figure 9:
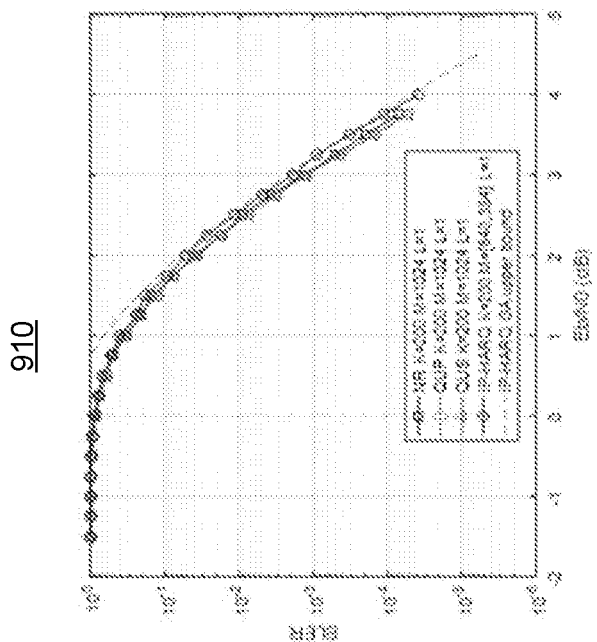

FIG. 9 shows examples 910, 920 of IP-HARQ performance relative to a baseline and bound of a GA with a first transmission length ($M_1$) of 512 bits, a second transmission length ($M_2$) of 384 bits, and a codeword length (K) of 200 bits. In example 910, a first 1024 bit transmission is sent using a puncture rate-matching scheme, and in example 920, a second 512 bit transmission is sent using a shorten rate-matching scheme. As shown, the IP-HARQ performance is within a bound of the GA. Furthermore, joint decoding of received transmissions under the IP-HARQ achieve an acceptable performance. Accordingly, IP-HARQ can achieve acceptable performance using different code lengths and/or different rate-matching schemes.

Figure 10:
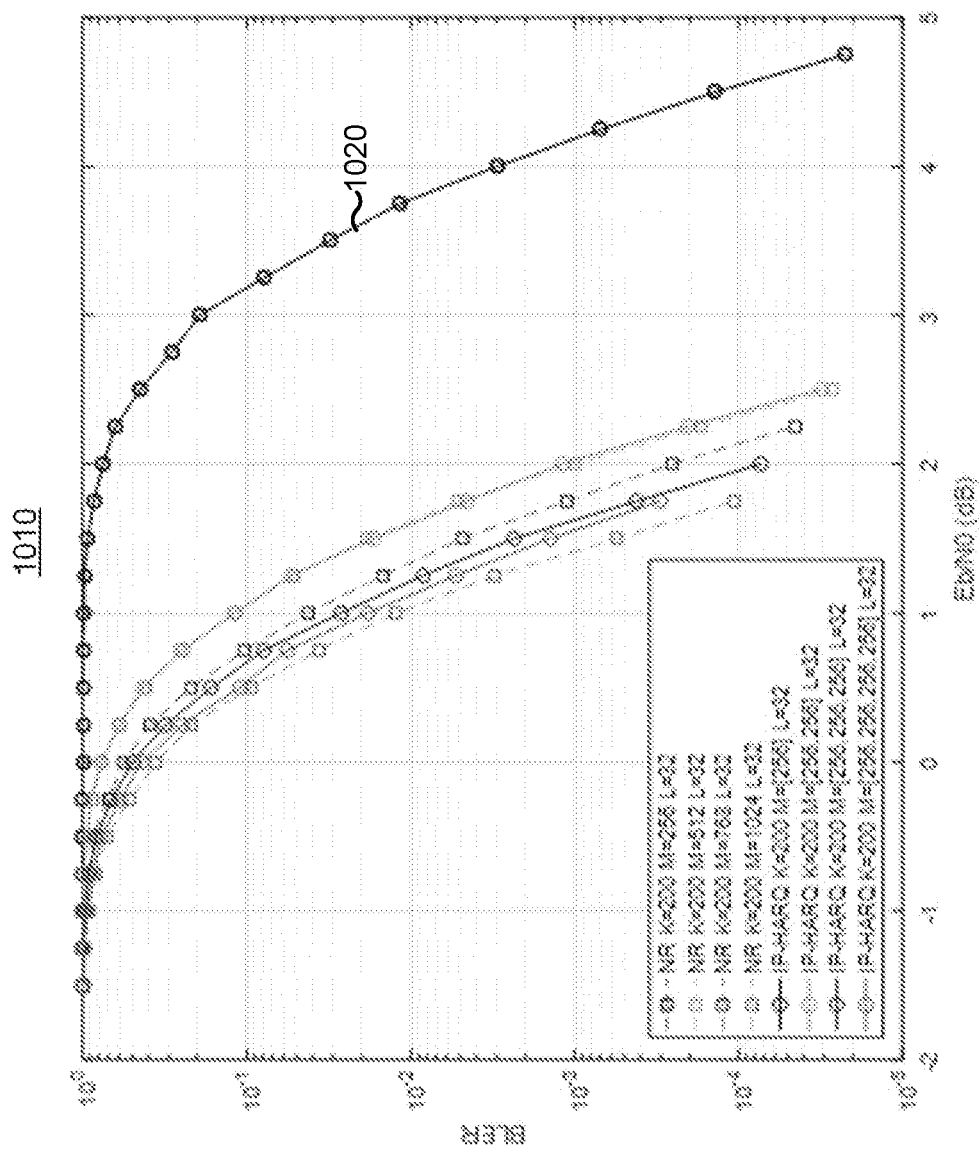

FIG. 10 shows an example 1010 of IP-HARQ performance of four transmissions. Notably, a third transmission, shown by reference number 1020, shows improved performance over baseline HARQ transmissions by using IP-HARQ.

Figure 11:
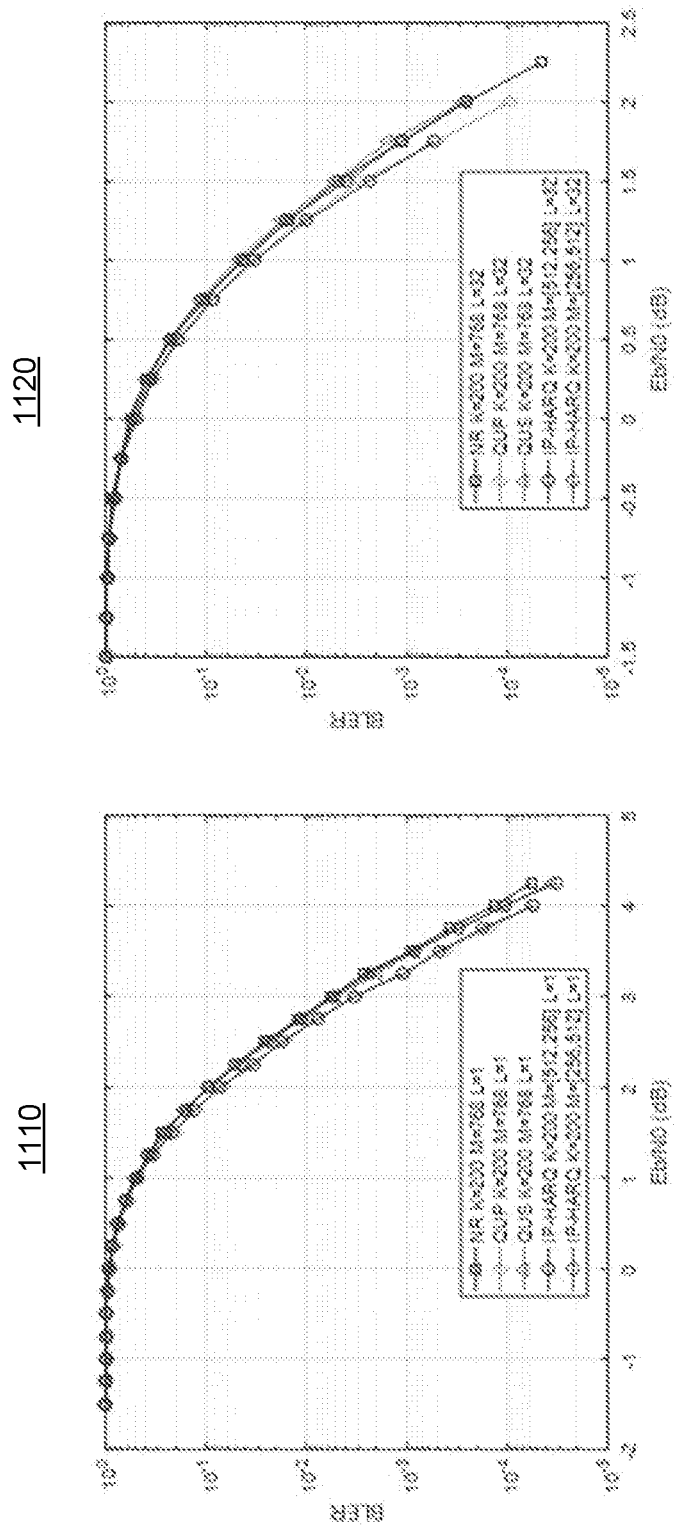

FIG. 11 shows examples 1110, 1120 of IP-HARQ performance relative to a baseline performance for two transmission with varying rate-matching schemes. Example 1110 has a first transmission length ($M_1$) of 512 bits and a second transmission length ($M_2$) of 256 bits, and a codeword length (K) of 200 bits. Example 1120 has a first transmission length ($M_1$) of 256 bits and a second transmission length ($M_2$) of 512 bits, and a codeword length (K) of 200 bits. As shown, when comparing example 1110 and example 1120, there is better decoding performance in IP-HARQ when $M_1 > M_2$ (i.e., the case shown by reference number 1110 shows better performance than the case shown by reference number 1120), though both may achieve acceptable performance.

Figure 12:
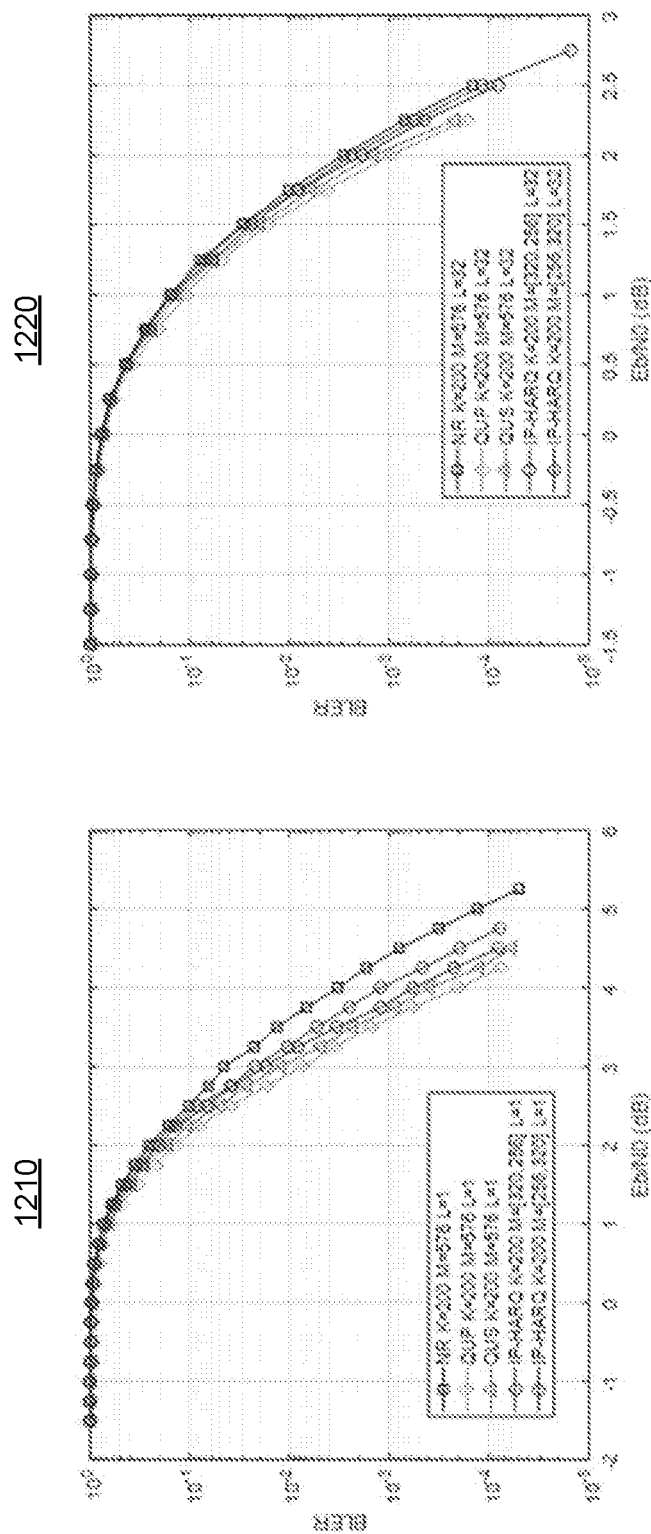

FIG. 12 shows examples 1210, 1220 of IP-HARQ performance relative to a baseline performance for two transmission with varying data bit length and rate-matching schemes. Example 1210 has a first transmission length ($M_1$) of 320 bits and a second transmission length ($M_2$) of 256 bits, and a codeword length (K) of 200 bits, using an $N_1$ of 512 (using shorten rate-matching) and an $N_2$ of 256. Example 1220 has a first transmission length ($M_1$) of 256 bits and a second transmission length ($M_2$) of 320 bits, and a codeword length (K) of 200 bits, using an $N_1$ of 256 and an $N_2$ of 512 (using shorten rate-matching). As shown, when comparing example 1210 and example 1220, there is better decoding performance in IP-HARQ when $M_1 > M_2$, though both may achieve acceptable performance.

Figure 13:
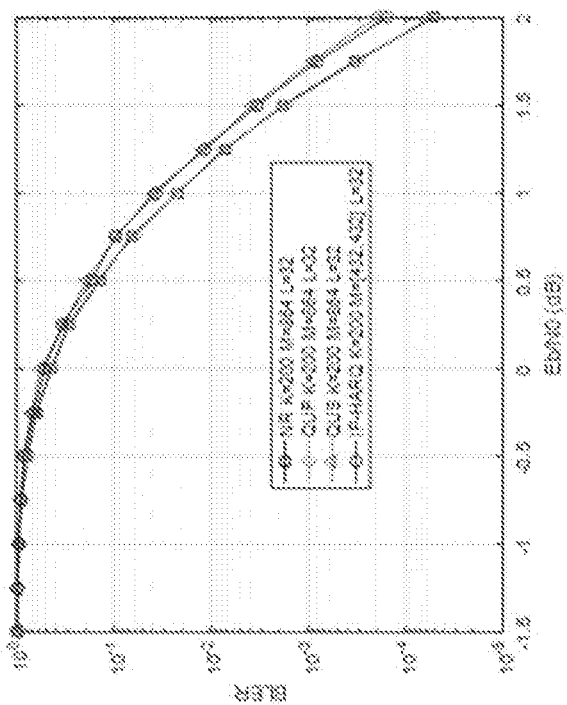
Figure 13:
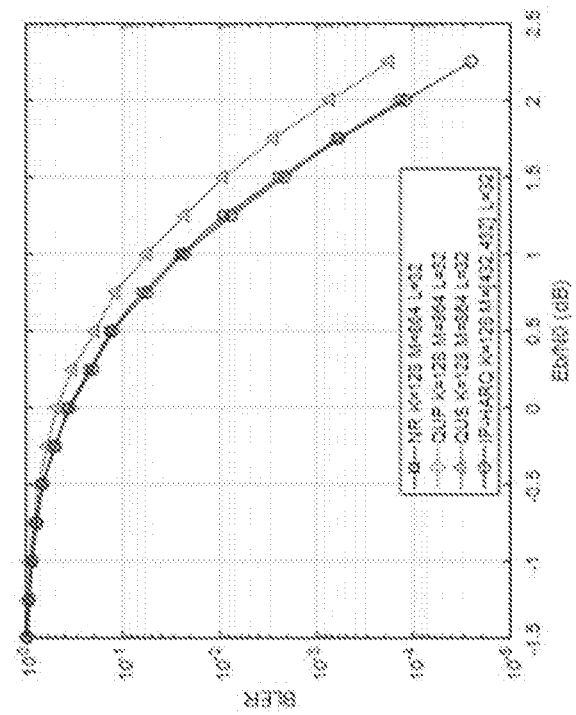

FIG. 13 shows examples 1310, 1320 of IP-HARQ performance relative to a baseline performance for two transmission with varying codeword length (K). Example 1310 has first transmission length ($M_1$) and second transmission length ($M_2$) of 432 bits and a codeword length (K) of 200 bits, using puncture rate-matching. Example 1320 has first transmission length ($M_1$) and second transmission length ($M_2$) of 432 bits and a codeword length (K) of 128 bits, also using puncture rate-matching. As shown, both examples 1310, 1320 may achieve acceptable performance.

As indicated above, FIGS. 8-13 are provided as examples. Other examples may differ from what is described in connection with FIGS. 8-13.

Figure 14:
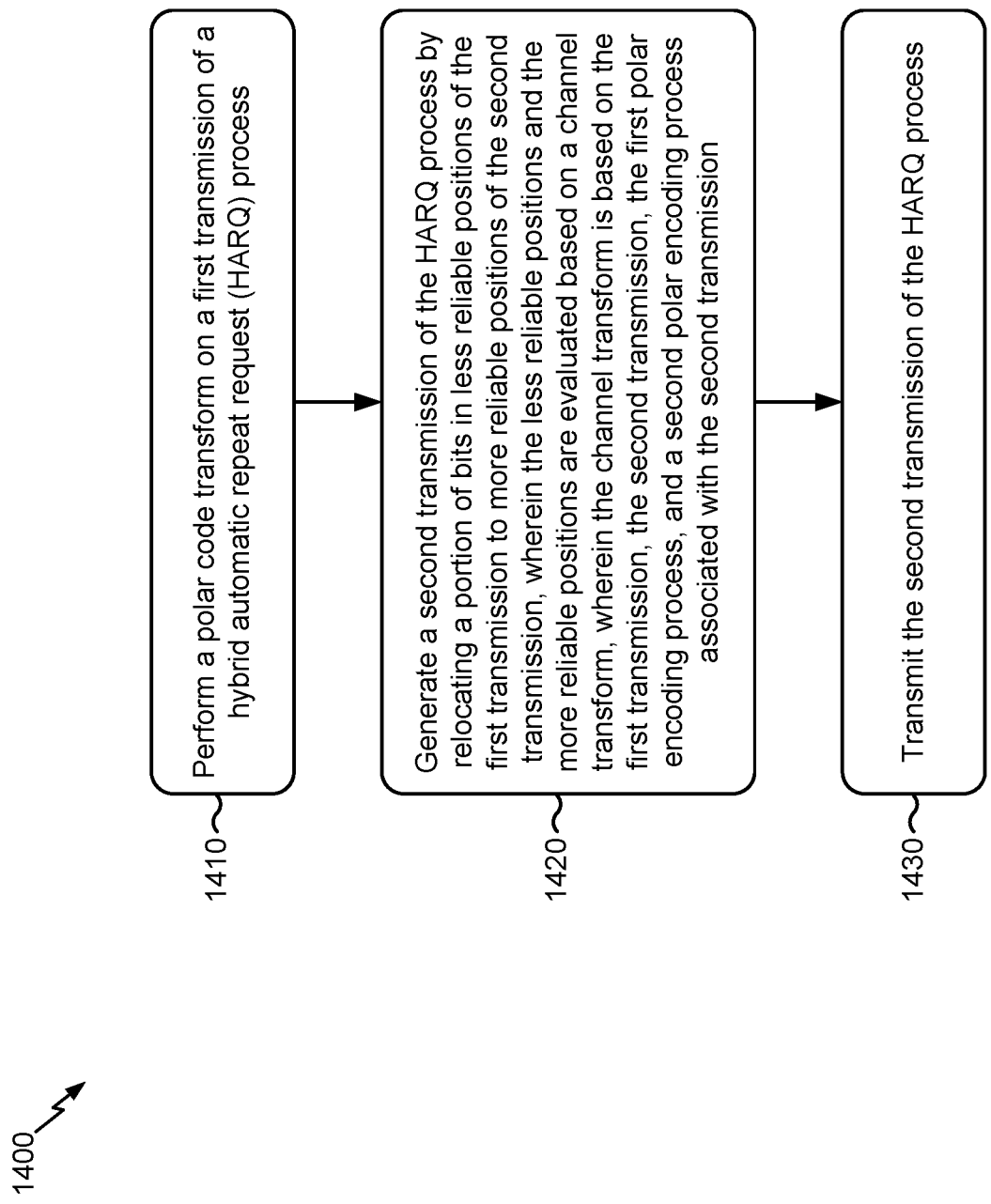
FIG. 14 is a diagram illustrating an example process performed, for example, by a wireless communication device, in accordance with various aspects of the present disclosure.

FIG. 14 is a diagram illustrating an example process 1400 performed, for example, by a wireless communication device, in accordance with various aspects of the present disclosure. Example process 1400 is an example where a wireless communication device (e.g., BS 110 and/or UE 120) performs a HARQ process using an incremental channel transform for each round of the HARQ process to move bits in less reliable positions of one or more previous transmissions to more reliable positions of one or more subsequent transmissions.

As shown in FIG. 14, in some aspects, process 1400 may include performing a first polar code encoding process on a first transmission of a HARQ process (block 1410). For example, a wireless communication device, such as BS 110 (e.g., using transmit processor 220, TX MIMO processor 230, controller/processor 240, and/or the like) and/or UE 120 (e.g., using transmit processor 264, TX MIMO processor 266, controller/processor 280, and/or the like), may performing a first polar code encoding process on a first transmission of a HARQ process.

As further shown in FIG. 14, in some aspects, process 1400 may include generating a second transmission of the HARQ process by relocating a portion of bits in less reliable positions of the first transmission to more reliable positions of the second transmission of the HARQ process, wherein the less reliable positions and the more reliable positions are evaluated based at least in part on a channel transform, wherein the channel transform is based at least in part on the first transmission, the second transmission, the first polar encoding process and a second polar encoding process associated with the second transmission (block 1420). For example, a wireless communication device, such as BS 110 (e.g., using transmit processor 220, TX MIMO processor 230, controller/processor 240, and/or the like) and/or UE 120 (e.g., using transmit processor 264, TX MIMO processor 266, controller/processor 280, and/or the like), may generate a second transmission a second transmission of the HARQ process by relocating a portion of bits in less reliable positions of the first transmission to more reliable position of the second transmission of the HARQ process.

As further shown in FIG. 14, in some aspects, process 1400 may include transmitting the second transmission of the HARQ process (block 1430). For example, a wireless communication device, such as BS 110 (e.g., using controller/processor 240, transmit processor 220, TX MIMO processor 230, MOD 232, antenna 234, and/or the like) and/or UE 120 (e.g., using controller/processor 240, transmit processor 220, TX MIMO processor 230, MOD 232, antenna 234, and/or the like), may transmit the second transmission of the HARQ process.

Process 1400 may include additional aspects, such as any single aspect and/or any combination of aspects described below and/or in connection with one or more other processes described elsewhere herein.

In some aspects, in some aspects, the channel transform is based at least in part on a round, of the HARQ process, associated with the second transmission.

In some aspects, the second transmission is generated from a codeword of the first transmission and the first polar encoding process associated with the first transmission, wherein the codeword is generated from data, of the first transmission, transformed by the first polar encoding process.

In some aspects, the codeword is generated to include a number of bits corresponding to a transmission length of the HARQ process by inserting one or more zero bits after the data transformed by the first polar encoding process when a length of the data is less than the transmission length.

In some aspects, the second transmission is generated by rate-matching a codeword of the second transmission, wherein the codeword of the second transmission is generated using the channel transform and a codeword of the first transmission.

In some aspects, the codeword of the second transmission comprises a number of bits corresponding to a number of bits of data used to generate the codeword of the first transmission.

In some aspects, the channel transform uses an Arikan kernel matrix.

In some aspects, the channel transform uses an upper-triangular matrix.

In some aspects, the upper-triangular matrix comprises a transpose of an Arikan kernel matrix.

In some aspects, the upper-triangular matrix comprises a diagonal kernel matrix.

In some aspects, the upper-triangular matrix comprises a First-exclusive OR-Latest (FL) kernel matrix.

In some aspects, the first transmission has a different code length than the second transmission.

In some aspects, the second transmission is transmitted using a different rate-matching scheme than the first transmission.

In some aspects, the channel transform is a first channel transform, and a third transmission of the HARQ process is generated by relocating bits in a set of less reliable positions of the first transmission and second transmission to a set of more reliable positions of the third transmission of the HARQ process, wherein the less reliable positions of the first transmission and second transmission and the more reliable positions of the third transmission are evaluated based at least in part on a second channel transform, wherein the second channel transform is based at least in part on the first transmission, the second transmission, third transmission and a polar encoding process associated with the third transmission.

Although FIG. 1400 shows example blocks of process 1400, in some aspects, process 1400 may include additional blocks, fewer blocks, different blocks, or differently arranged blocks than those depicted in FIG. 14. Additionally, or alternatively, two or more of the blocks of process 1400 may be performed in parallel.

The foregoing disclosure provides illustration and description, but is not intended to be exhaustive or to limit the aspects to the precise form disclosed. Modifications and variations are possible in light of the above disclosure or may be acquired from practice of the aspects.

As used herein, the term component is intended to be broadly construed as hardware, firmware, or a combination of hardware and software. As used herein, a processor is implemented in hardware, firmware, or a combination of hardware and software.

Some aspects are described herein in connection with thresholds. As used herein, satisfying a threshold may refer to a value being greater than the threshold, greater than or equal to the threshold, less than the threshold, less than or equal to the threshold, equal to the threshold, not equal to the threshold, and/or the like.

It will be apparent that systems and/or methods, described herein, may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of possible aspects. In fact, many of these features may be combined in ways not specifically recited in the claims and/or disclosed in the specification. Although each dependent claim listed below may directly depend on only one claim, the disclosure of possible aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a wireless communication device, comprising:
   performing a first polar encoding process on a first transmission of a hybrid automatic repeat request (HARQ) process;
   generating a second transmission of the HARQ process by relocating a portion of bits in less reliable positions of the first transmission to more reliable positions of the second transmission of the HARQ process,
      wherein the less reliable positions and the more reliable positions are evaluated based at least in part on a channel transform matrix,
         wherein the channel transform matrix is based at least in part on the first transmission, the second transmission, the first polar encoding process and a second polar encoding process associated with the second transmission; and
   transmitting the second transmission of the HARQ process.

2. The method of claim 1, wherein the channel transform matrix is based at least in part on a round, of the HARQ process, associated with the second transmission.

3. The method of claim 1, wherein the second transmission is generated from a codeword of the first transmission and the first polar encoding process associated with the first transmission,
   wherein the codeword is generated from data, of the first transmission, transformed by the first polar encoding process.

4. The method of claim 3, wherein the codeword is generated to include a number of bits corresponding to a transmission length of the HARQ process by inserting one or more zero bits after the data transformed by the first polar encoding process when a length of the data is less than the transmission length.

5. The method of claim 1, wherein the second transmission is generated by rate-matching a codeword of the second transmission,
   wherein the codeword of the second transmission is generated using the channel transform and a codeword of the first transmission.

6. The method of claim 5, wherein the codeword of the second transmission comprises a number of bits corresponding to a number of bits of data used to generate the codeword of the first transmission.

7. The method of claim 1, wherein the channel transform matrix comprises an Arikan kernel matrix.

8. The method of claim 1, wherein the channel transform matrix comprises an upper-triangular matrix.

9. The method of claim 8, wherein the upper-triangular matrix comprises a transpose of an Arikan kernel matrix.

10. The method of claim 8, wherein the upper-triangular matrix comprises a diagonal kernel matrix.

11. The method of claim 8, wherein the upper-triangular matrix comprises a First-exclusive OR-Latest (FL) kernel matrix.

12. The method of claim 1, wherein the first transmission has a different code length than the second transmission.

13. The method of claim 1, wherein the second transmission is transmitted using a different rate-matching scheme than the first transmission.

14. The method of claim 1, wherein the channel transform matrix is a first channel transform matrix, and a third transmission of the HARQ process is generated by relocating bits in a set of less reliable positions of the first transmission and second transmission to a set of more reliable positions of the third transmission of the HARQ process,
   wherein the less reliable positions of the first transmission and second transmission and the more reliable positions of the third transmission are evaluated based at least in part on a second channel transform channel transform,
      wherein the second channel transform channel transform is based at least in part on the first transmission, the second transmission, third transmission and a polar encoding process associated with the third transmission.

15. A wireless communication device, comprising:
   a memory; and
   one or more processors operatively coupled to the memory, the memory and the one or more processors configured to:
      perform a first polar encoding process on a first transmission of a hybrid automatic repeat request (HARQ) process;
      generate a second transmission of the HARQ process by relocating a portion of bits in less reliable positions of the first transmission to more reliable positions of the second transmission of the HARQ process,
         wherein the less reliable positions and the more reliable positions are evaluated based at least in part on a channel transform matrix,
            wherein the channel transform matrix is based at least in part on the first transmission, the second transmission, the first polar encoding process and a second polar encoding process associated with the second transmission; and
      transmit the second transmission of the HARQ process.

16. The wireless communication device of claim 15, wherein the channel transform matrix is based at least in part on a round, of the HARQ process, associated with the second transmission.

17. The wireless communication device of claim 15, wherein the second transmission is generated from a codeword of the first transmission and the first polar encoding process associated with the first transmission,
   wherein the codeword is generated from data, of the first transmission, transformed by the first polar encoding process.

18. The wireless communication device of claim 15, wherein the second transmission is generated by rate-matching a codeword of the second transmission,
   wherein the codeword of the second transmission is generated using the channel transform and a codeword of the first transmission.

19. The wireless communication device of claim 15, wherein the channel transform matrix comprises an Arikan kernel matrix.

20. The wireless communication device of claim 15, wherein the channel transform matrix comprises an upper-triangular matrix.

21. The wireless communication device of claim 20, wherein the upper-triangular matrix comprises a diagonal kernel matrix.

22. The wireless communication device of claim 20, wherein the upper-triangular matrix comprises a First-exclusive OR-Latest (FL) kernel matrix.

23. The wireless communication device of claim 15, wherein the first transmission has a different code length than the second transmission.

24. The wireless communication device of claim 15, wherein the second transmission is transmitted using a different rate-matching scheme than the first transmission.

25. A non-transitory computer-readable medium storing one or more instructions for wireless communication, the one or more instructions comprising:
one or more instructions that, when executed by one or more processors of a wireless communication device, cause the one or more processors to:
perform a first polar encoding process on a first transmission of a hybrid automatic repeat request (HARQ) process;
generate a second transmission of the HARQ process by relocating a portion of bits in less reliable positions of the first transmission to more reliable positions of the second transmission of the HARQ process,
wherein the less reliable positions and the more reliable positions are evaluated based at least in part on a channel transform matrix,
wherein the channel transform matrix is based at least in part on the first transmission, the second transmission, the first polar encoding process and a second polar encoding process associated with the second transmission; and
transmit the second transmission of the HARQ process.

26. The non-transitory computer-readable medium of claim 25, wherein the channel transform matrix comprises an upper-triangular matrix.

27. The non-transitory computer-readable medium of claim 26, wherein the upper-triangular matrix comprises a diagonal kernel matrix.

28. The non-transitory computer-readable medium of claim 26, wherein the upper-triangular matrix comprises a First-exclusive OR-Latest (FL) kernel matrix.

29. An apparatus for wireless communication, comprising:
means for performing a first polar encoding process on a first transmission of a hybrid automatic repeat request (HARQ) process;
means for generating a second transmission of the HARQ process by relocating a portion of bits in less reliable positions of the first transmission to more reliable positions of the second transmission of the HARQ process,
wherein the less reliable positions and the more reliable positions are evaluated based at least in part on a channel transform matrix,
wherein the channel transform matrix is based at least in part on the first transmission, the second transmission, the first polar encoding process and a second polar encoding process associated with the second transmission; and
means for transmitting the second transmission of the HARQ process.

30. The apparatus of claim 29, wherein the channel transform matrix is based at least in part on a round, of the HARQ process, associated with the second transmission.

* * * * *